United States Patent
Fu et al.

(10) Patent No.: US 8,384,401 B2
(45) Date of Patent: Feb. 26, 2013

(54) FAST TIME-TAGGED EVENT DETECTION USING RESISTIVE SWITCHING DEVICES

(75) Inventors: Kai-Mei Fu, Palo Alto, CA (US); John Paul Strachan, Millbrae, CA (US); Raymond Beausoleil, Redmond, WA (US); Julien Borghetti, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 456 days.

(21) Appl. No.: 12/751,739

(22) Filed: Mar. 31, 2010

(65) Prior Publication Data

US 2011/0241756 A1    Oct. 6, 2011

(51) Int. Cl.
*G01R 27/08* (2006.01)

(52) U.S. Cl. .................................. 324/691; 324/702

(58) Field of Classification Search .................. None
See application file for complete search history.

(56) References Cited

U.S. PATENT DOCUMENTS

| 5,315,131 A * | 5/1994 | Kishimoto et al. ............. 257/57 |
| 2011/0024714 A1 * | 2/2011 | Wu et al. ............................ 257/4 |

* cited by examiner

*Primary Examiner* — Minh N Tang
(74) *Attorney, Agent, or Firm* — Yeh K. Chang

(57) ABSTRACT

A system for event detection uses a resistive switching device to record a detected event. The resistive switching device has a resistance adjustable by an applied voltage. The operation of the resistive switching device is controlled by a controller, which is configured to apply a switching voltage to the resistive switching device at a start time, and turn off the switching voltage in response to an event signal indicative of occurrence of an event. The resistance value of the resistive switching device resulting from the application of the switching voltage is indicative of the detection of the event and also the time of the occurrence of the event.

13 Claims, 6 Drawing Sheets

FAST TIME-TAGGED EVENT DETECTION USING RESISTIVE SWITCHING DEVICES

BACKGROUND

Many scientific and engineering applications require the ability to detect and analyze the time profile of fast-occurring events. For instance, many research projects involve the study of light emission (e.g., laser pulses, photoluminescence, electro-luminescence, etc.) which has very short duration, typically ranging from nanoseconds to sub-picoseconds, and it is necessary to know how the intensity and spatial distribution of the light changes as a function of time. Due to the very short durations of such events, however, it can be quite a challenge to record the time information of the event progression, and some creative ways have to be implemented to convert the time information into some other quantities that can be more easily measured.

For example, a streak camera is often used to analyze the time profile of laser pulses. The streak camera converts an incident laser pulse into photoelectrons, which are deflected to different angles based on their arrival time and projected onto a phosphorus screen to form a streak of light, and the position in the streak corresponds to the time of incidence of the photons in the pulse. The streak image is captured using a charge coupled device (CCD) so that it can be stored and analyzed to derive the time profile of the laser pulse. In this example, the steak camera functions as a time-to-space converter. There are also other approaches to measuring the time profiles of fast events, such as converting time into the amplitude of an electrical pulse. Those conventional time measurement approaches have various issues and disadvantages. For instance, time-to-space converters tend to be very large, and time-to-amplitude converters produce electric pulses that by nature are volatile and have to be detected by other means.

BRIEF DESCRIPTION OF THE DRAWINGS

Some embodiments of the invention are described, by way of example, with respect to the following figures.

DETAILED DESCRIPTION

Figure 1:
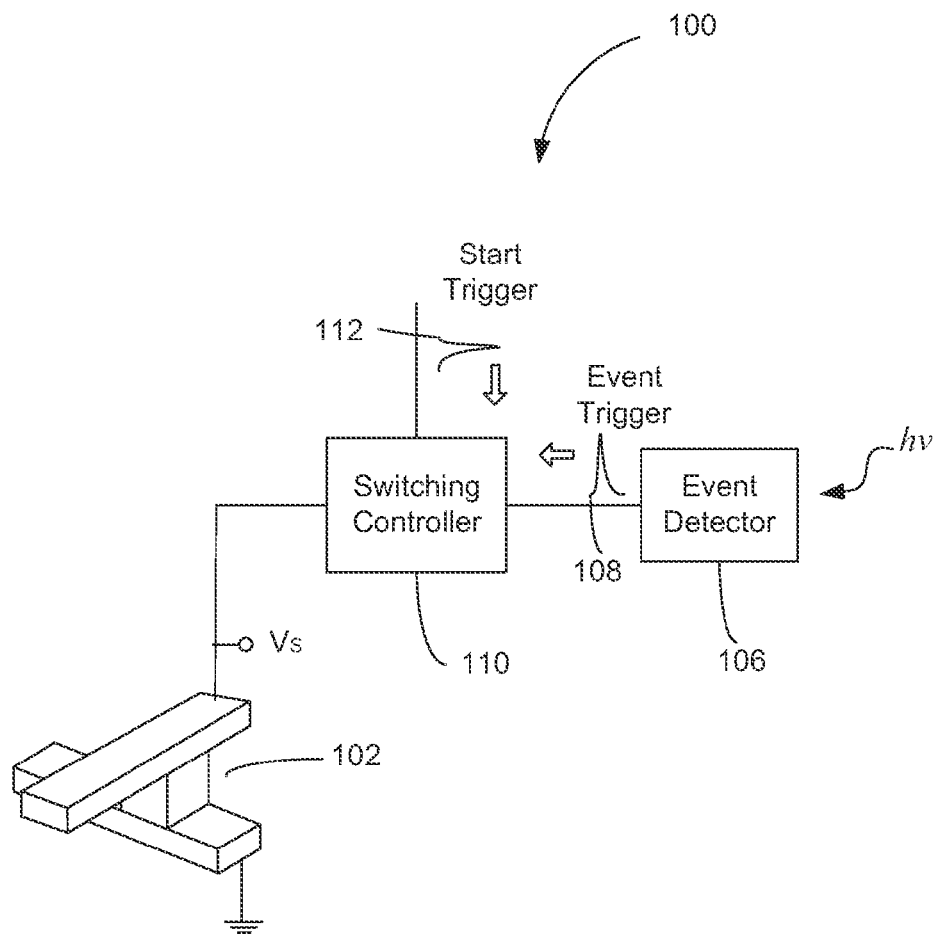
FIG. 1 is a schematic perspective view of a system of an embodiment of the invention for time-tagged event detection using a resistive switching device.

FIG. 1 shows a system 100 in accordance with an embodiment of the invention for event detection. In addition to detecting and recording the occurrence of an event, the system also time-tags the event. As used herein, the term "time-tagging" means that the system generates an indicator that provides information about the timing of the detected event. In accordance with a feature of embodiments of the invention, the time-tagging functionality is provided by using a resistive-switching device 102.

As shown in FIG. 1, the system may include an event detector 106 that generates a signal when an event is detected. The event may be, for example, the incidence of a photon in a light pulse, the onset of an electric or magnetic pulse, the capturing of a particle (e.g., a sub-atomic particle), etc. The signal 108 generated by the event detector 106 is transmitted to a controller 110, which controls the operation of the resistive switching device 102 to record the detection of the event. In some embodiments, if the event itself is an electric signal that can be recognized directly by the controller, then an event detector might not be necessary and the electric signal could be the signal 108 received by the controller 110. As described in greater detail below, the resistive switching device 102 has a variable resistance that can be changed under the control of the controller 110 to provide not only an indication of whether an event has occurred but also information about the timing of the detected event.

Figure 2:
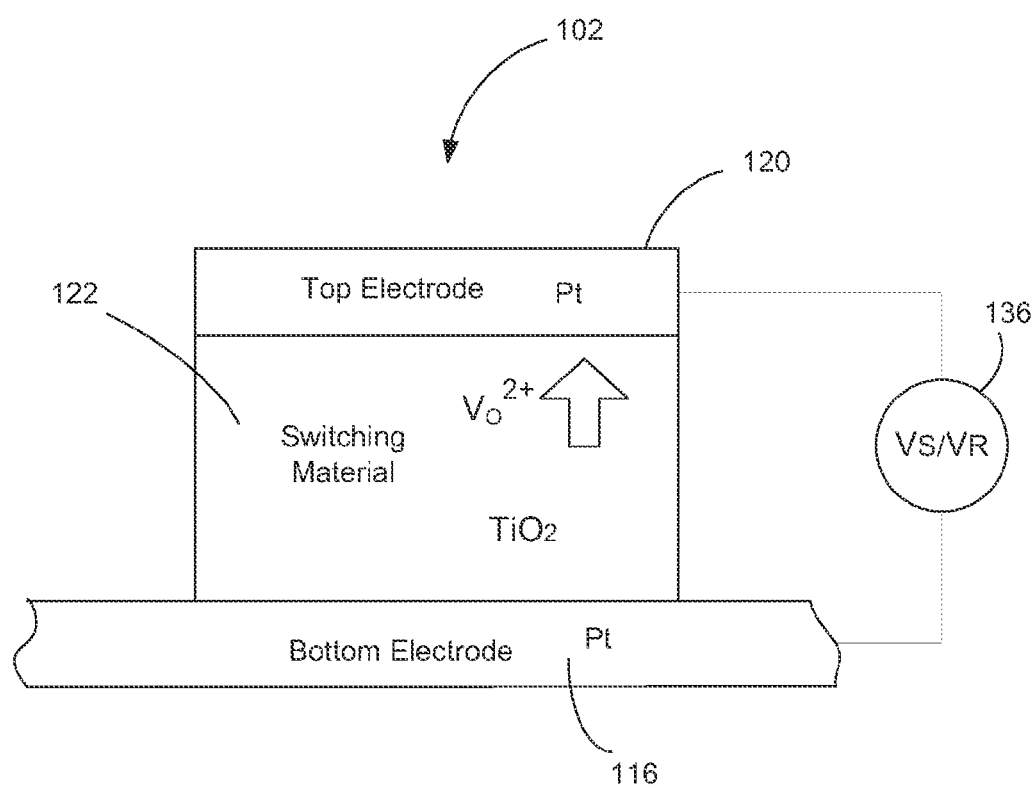
FIG. 2 is a schematic cross-sectional view of an embodiment of the resistive switching device used in FIG. 1 for event recording and time-tagging.

Turning now to FIG. 2, in one embodiment, the resistive switching device comprises a bottom electrode 116 and a top electrode 120 extending over the bottom electrode. Disposed between the top and bottom electrode 120 and 116 is an active region 122 that exhibits the switching behavior. Each of the top and bottom electrodes 120 and 116 may have a width and a thickness on the nanoscale. As used hereinafter, the term "nanoscale" means the object has one or more dimensions smaller than one micrometer, and in some embodiments less than 500 nanometers and often less than 100 nanometers. For example, the electrodes 120 and 116 may have a width in the range of 10 nm to 500 nm, and a thickness in the range of 5 nm and 500 nm. Likewise, the active region 122 may have a height that is on the nanoscale and typically from a few nanometers to tens of nanometers. The electrodes 120 and 116 are formed of a conductive material, which may be a metal such as platinum, gold, copper, tantalum, tungsten, etc., or doped semiconductor materials. In the embodiment shown in FIG. 2, the top electrode 120 extends at an angle to the bottom electrode 116. The angle may be, for example, around 90 degrees, but may be of other values depending on the device design.

The active region 122 disposed between the top electrode 120 and bottom electrode 116 contains a switching material. The switching material is capable of carrying a species of mobile ionic dopants such that the dopants can be controllably trans-ported through the switching material and redistributed over the active region 122. The redistribution of the dopants changes the electrical properties of either the switching material or the interface of the switching material and an electrode, which in the illustrated example of FIG. 2 may be the top electrode 120. This ability to change the electrical properties as a function of dopant distribution allows the switching device 102 to be placed in different resistance states by applying a voltage from a voltage source 136 to the electrodes 120 and 116. Switching devices of this type have been identified as a form of "memristors." They are non-volatile elements which change state (resistance) in a continuous manner in response to the flow of charge through the device under an applied field. The continuous range of states, the scaling properties, and the non-volatility, are properties of such resistive switching devices that may be advantageously used for implementing embodiments of this invention.

Generally, the switching material may be electronically semiconducting or nominally insulating and a weak ionic conductor. Many different materials with their respective suitable dopants can be used as the switching material. Materials that exhibit suitable properties for resistive switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The III-V semiconductors include, for instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. These listings of possible switching materials are not exhaustive and do not restrict the scope of the present invention.

The dopant species used to alter the electrical properties of the switching material depends on the particular type of switching material chosen, and may be cations, anions or vacancies, or impurities as electron donors or acceptors. For instance, in the case of a transition metal oxide such as $TiO_2$, the dopant species may be oxygen vacancies ($V_o^{2+}$). For GaN, the dopant species may be nitride vacancies or sulfide ion dopants. For compound semiconductors, the dopants may be n-type or p-type impurities.

By way of example, as illustrated in FIG. 2, the switching material may be $TiO_2$, and the dopants may be oxygen vacancies ($V_o^{2+}$). Initially, there may be an asymmetry in the dopant distribution. For example, the dopant concentration may have a gradient across the active region 122, being higher around the bottom electrode 116 and substantially lower around the top electrode 120. In this regard, in some embodiments, a region (e.g., adjacent the bottom electrode 116) may be formed to have a high concentration of dopants to serve as a reservoir of dopants that can be redistributed over the active region during a switching operation. When a DC switching voltage from the voltage source 136 is applied to the top and bottom electrodes 120 and 116, an electrical field is created across the active region 122. This electric field, if of sufficient strength and proper polarity, may drive the oxygen vacancies to drift through the switching material in the active region 122 towards the top electrode 120, thereby turning the device into an ON state that has a low resistance.

If the polarity of the electrical field is reversed, the oxygen vacancies may drift in an opposite direction across the active region 122 and away from the top electrode 120, thereby turning the device into an OFF state with a high resistance. In this way, the switching is reversible and may be repeated. Moreover, the switching device 102 may be put in an intermediate state with a resistance value between the ON an OFF resistance values. Due to the relatively large electrical field needed to cause dopant drifting, after the switching voltage is removed, the locations of the dopants remain stable in the switching material. In other words, the switching may be non-volatile. The state of the switching device 102 may be read by applying a read voltage from the voltage source 136 to the top and bottom electrodes 120 and 116 to sense the resistance across these two electrodes. The read voltage is typically much lower than the switching voltage required to cause drifting of the ionic dopants in the active region 122, so that the read operation does not alter the ON/OFF state of the switching device.

The switching behavior described above may be based on different mechanisms. In one mechanism, the switching behavior may be an "interface" phenomenon. For instance, in the illustrated example of FIG. 2, initially, with a low concentration of oxygen vacancies in the $TiO_2$ switching material near the top electrode 120, the interface of the switching material and the top electrode 120 may behave like a Schottky barrier, with an electronic barrier that is difficult for electrons to go through. Similarly, the interface of the switching material and the bottom electrode 116 may also behave like a Schottky barrier, with a flow direction opposite to that of the Schottky-like barrier at the top electrode 120. As a result, the device 102 has a relatively high resistance in either flow direction. When a switching voltage is applied to the top and bottom electrodes 120 and 116 to turn the device ON, with the top electrode as the negative side, the oxygen vacancies drift towards the top electrodes 120. The increased concentration of dopants near the top electrode 120 changes the electrical property of the interface from one like a Schottky barrier to one like an Ohmic contact, with a significantly reduced electronic barrier height or width. As a result, electrons can tunnel through the interface much more easily, and the switching device 102 is now in the ON state with a significantly reduced overall resistance for a current flowing from the bottom electrode 116 to the top electrode 120.

In another mechanism, the reduction of the resistance of the active region 122 may be a "bulk" property of the switching material. The redistribution of the dopant level in the switching material causes the resistance across the switching material to fall, and this may account for the decrease of the resistance of the device between the top and bottom electrodes 120 and 116. It is also possible that the resistance change is the result of a combination of both the bulk and interface mechanisms. Even though there may be different mechanisms for explaining the switching behavior, it should be noted that the present invention does not rely on or depend on any particular mechanism for validation, and the scope of the invention is not restricted by which switching mechanism is actually at work.

Figure 3:
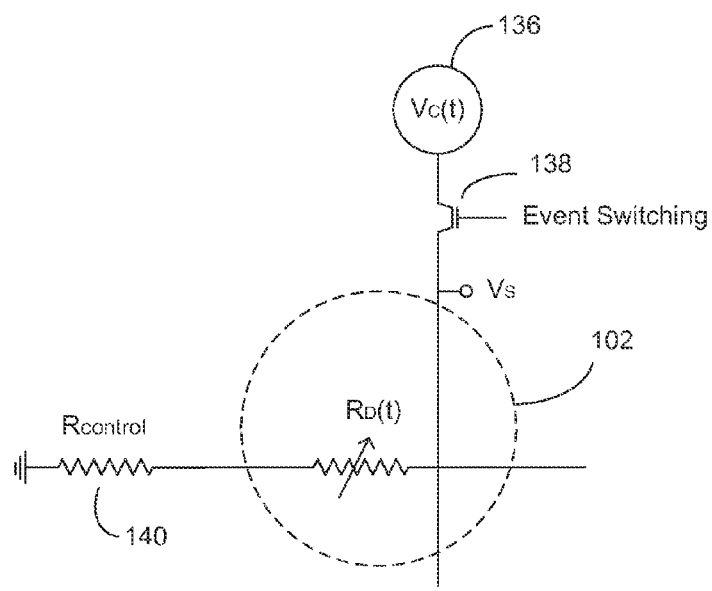
FIG. 3 is a schematic diagram showing an electric representation of the resistive switching device.

As described above, the resistance of the resistive switching device 102 of the embodiment of FIG. 2 can be changed by the redistribution of dopants in the switching material, which is caused by the drifting of the dopants under a sufficiently strong electric field. This phenomenon is utilized as a mechanism for time tagging a detected event. As shown in FIG. 3, the switching device 102 may be viewed as having a variable resistance $R_D$, the value of which can be changed, as a function of time, by applying a switching voltage $V_S$ across the switching device. The switching voltage $V_S$ may be applied by connecting a control voltage $V_C$ from the voltage source 136. The connection of the control voltage $V_C$ to the switching device 102 may be controlled by means of a switch 138, such that the actual voltage $V_S$ applied across the switching device depends on the control voltage $V_C$ and the OPEN/CLOSE state of the switch 138. The value of the resistance $R_D$ depends on its starting value, the magnitude of the voltage $V_C$, and how long the voltage is applied. By knowing how $R_D$ depends on $V_C$ and t, the change in the value of $R_D$ can be used as an indicator of the time t. The functional dependence of $R_D$ on $V_C$ and t can be identified, for example, via a calibration process in which a known $V_C(t)$ is applied to the switching device over different time lengths. Alternatively or in conjunction with varying the control voltage $V_C$ and switching $V_C$ on and off by the switch 138, the switching voltage $V_S$ applied across the switching device 102 may also be modulated by device 140 with a controlled resistance that is connected in series with the switching device 102 to modulate the current flow across device $R_D$.

Figure 4A:
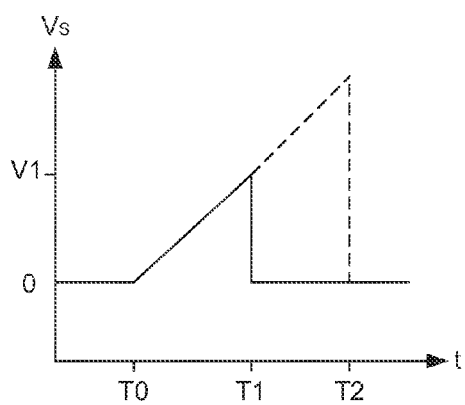
FIGS. 4A and 4B are charts showing two different voltage profiles that may be applied to the resistive switching device to change its resistance as a function of time in an event detection operation.
Figure 4B:
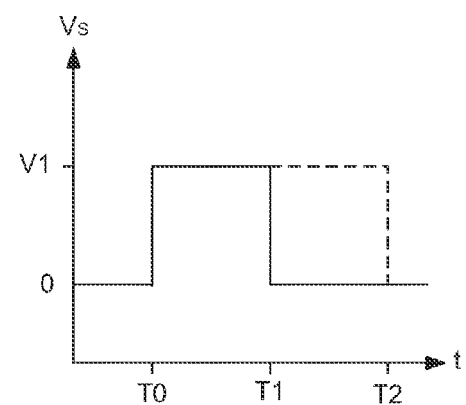

The switching voltage $V_S$ applied to the resistive switching device 102 during an event detection operation can be any suitable function of the time t. By way of example, FIGS. 4A and 4B shows two different time profiles of the voltage $V_S$ applied to the switching device, as a result of the variation of $V_C$ and the operation of the switch 138. For instance, as shown in FIG. 4A, the switch 138 may start in the closed or ON position, and $V_C$ may have a value of 0 before t=T0. At t=T0, the control voltage $V_C$ ramps up in magnitude as t increases, until it reaches the value $V_1$ at the time t=T1, at which point the switch 138 is turned off in response to an event trigger, such that the voltage $V_S$ applied to the switching device drops back to 0, while $V_C$ may continue to ramp up to a higher value.

As another example, as shown in FIG. 4B, $V_C$ may be set to 0 before t=0 and jumps up to a fixed voltage $V_1$ at t=T0 (i.e., a step function). Alternatively, $V_C$ may be always set to $V_1$, but the switch 138 is turned on at t=T0, so the applied voltage $V_S$ jumps up to $V_1$ at T0. $V_S$ then stays at that level until a later time t=T1, where the switch is turned off in response to an event trigger so that $V_S$ drops back to 0. As yet another example, $V_S$ may be the combination of a series of step functions with increasing values. The particular time profile of $V_S$ may be selected depending on the characteristics of the resistive switching device used, the event to be time-tagged, and specific setup of the event detection system, and other factors.

Figure 5A:
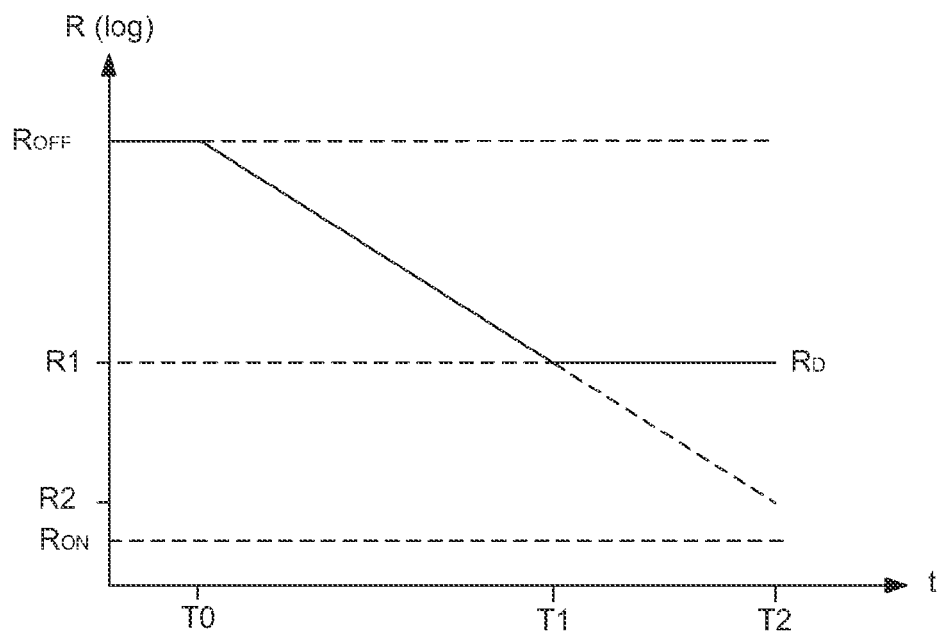
FIGS. 5A and 5B are charts showing two examples of how the resistance of the resistive switching device may change with time in an event detection operation.
Figure 5B:
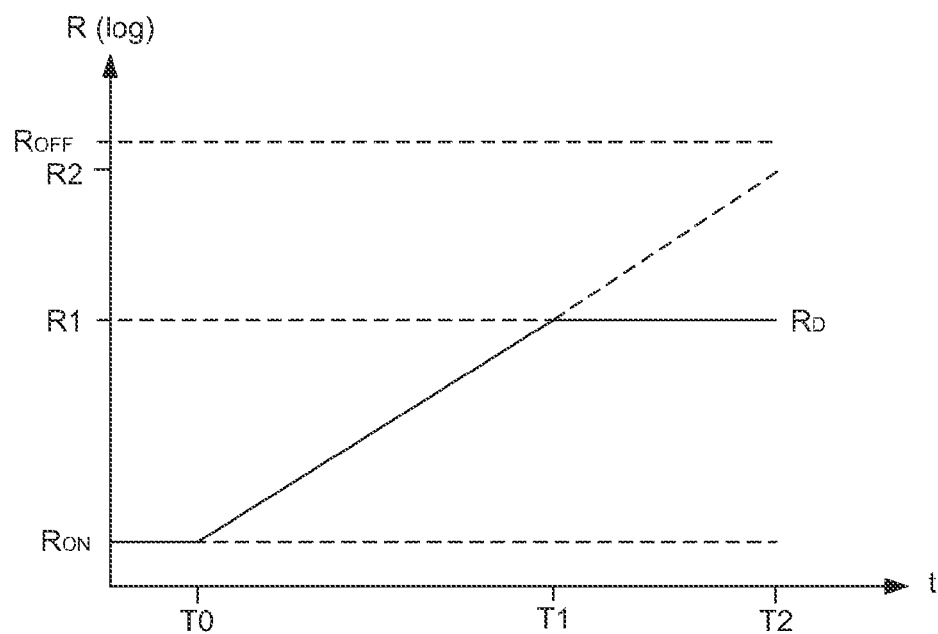

By way of example, FIGS. 5A and 5B illustrate how the resistance of the resistive switching device 102 may change as a function of time in an event detection operation. As shown in FIG. 5A, the switching device may originally be in its OFF state, and has a resistance value $R_{OFF}$. This value may be detected, for instance, by applying a read voltage that is lower than the voltage needed to cause dopant drifting, as described earlier. Referring also to FIG. 1, at t=T0, the switching controller 110 applies a switching voltage $V_S$ to the resistive switching device to move its electric state towards the ON state. The application of switching voltage $V_S$ may be triggered, for example, by an external signal 112 sent to the controller 110 to indicate the start of the event detection operation. Alternatively, the onset of the switching voltage may be based on an internal clock and algorithm of the controller 110. The application of the switching voltage $V_S$ causes the resistance $R_D$ of the resistive switching device 102 to fall as the time increases. If an event is detected at t=T1 by the event detector 106, the event detector generates a trigger signal 108, indicating that an event has been detected. In response to the trigger signal 108, the controller 110 turns off the switching voltage $V_S$. If, however, no event is detected, the controller continues to apply the switching voltage to the switching device until the end of the event detection period at t=T2. At that time, the device may be completely switched on, or still at an intermediate state between ON and OFF. After the event detection operation ends the resistance of the switching device can be detected by applying a read voltage to the switching device 102.

The switching voltage profile is selected such that the resistive switching device does not reach the ON state over the time period in which an event is expected to occur. If an event is detected, the resistance of the switching device has a value $R_1$ that is different from the resistance $R_2$ the device would have if the switching voltage is applied until the time T2. This value $R_1$, by being different from $R_2$, indicates that an event has been detected. Moreover, as described above, the particular time T1 of the event occurrence can be derived from the resistance value $R_1$ based on the knowledge of the dependence of $R_D$ on the applied switching voltage and the time. Thus, the detected event is time-tagged by the change of the resistance of the switching device. Because the time required to switch a resistive switching device 102 can be very short, on the order of nanoseconds or less, the switching device may be used to time tag fast events that occur in nanoseconds or even picoseconds.

FIG. 5B shows another mode of operation in which the switching device is initially at its ON state. At t=T0, a switching voltage $V_S$ is applied to move the electric state of the device towards its OFF state. As described above, t=T0 is a reference time that corresponds to the start of the event detection. With the application of the switching voltage $V_S$, the resistance of the device increases with time. If an event is detected by the event detector 106 at t=T1, the controller 110 is triggered to turn off the switching voltage, and the resistance of the device stays at the value $R_1$. If no event is detected, the switching voltage continues to be applied until the event detection ends at t=T2. At that time, the resistance $R_2$ of the switching device may or may not have reached the resistance $R_{OFF}$ of the device OFF state. Thereafter, the resistance of the switching device is sensed by applying a read voltage. A resistance value $R_1$ different from $R_2$ indicates that an event has been detected. In that case, the resistance value $R_1$ also provides an indication of the time T1 at which the event is detected.

Figure 6:
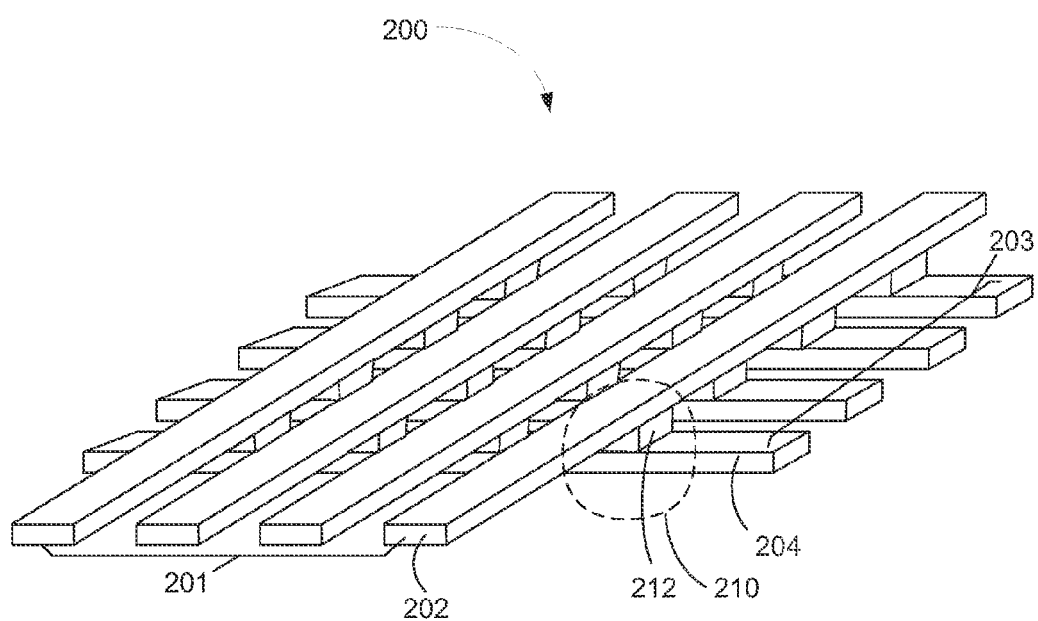
FIG. 6 is a schematic perspective view of a crossbar array of resistive switching devices.

Multiple resistive switching devices, each with a protective cladding layer, may be formed into a crossbar array for various applications. FIG. 6 shows an example of a two-dimensional array 200 of such switching devices. The array has a first group 201 of generally parallel nanowires 202 in a top layer, and a second group 203 of generally parallel nanowires 204 in a bottom layer. The nanowires 202 in the first group 201 run in a first direction, and the nanowires 204 in the second group 203 run in a second direction at an angle, such as 90 degrees, from the first direction. The two layers of nanowires form a two-dimensional crossbar structure, with each nanowire 202 in the top layer intersecting a plurality of the nanowires 204 of the bottom layer. A resistive switching device 210 may be formed at each intersection of the nanowires in this crossbar structure. The switching device 210 has a nanowire 202 of the first group 201 as its top electrode, and a nanowire 204 of the second group 203 as its bottom electrode. An active region 212 containing a switching material is disposed between the top and bottom nanowires 202 and 204.

Figure 7:
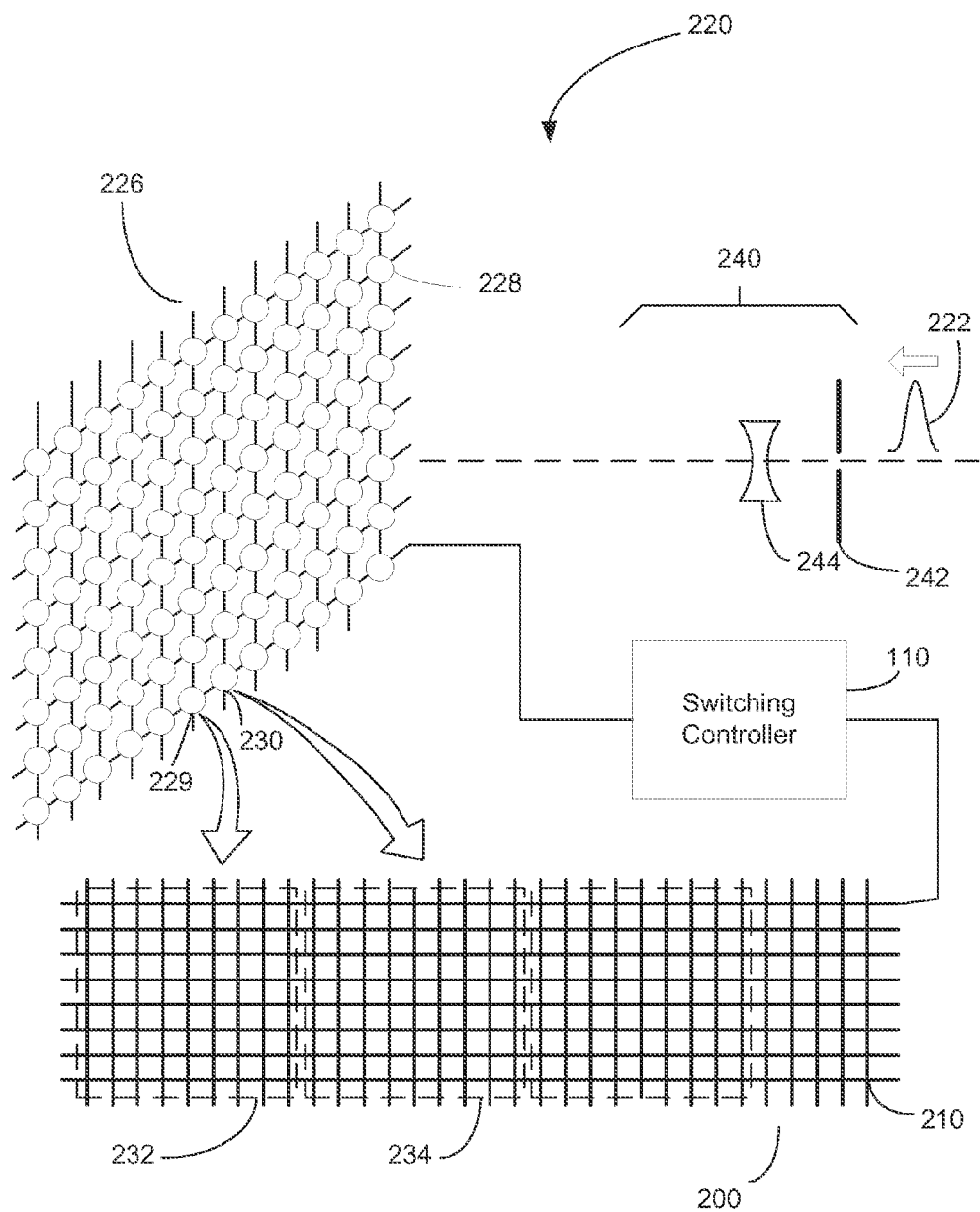
FIG. 7 is a schematic view of a system for detecting fast-varying optical signals using an array of resistive switching devices.

FIG. 7 shows a system 220 in which the two-dimensional crossbar array 200 of resistive switching devices is used for time tagging of detected events. In this embodiment, the system 220 is configured for detecting incident photons in a fast light pulse 222. The crossbar array 200 of resistive switching devices 210 can be used to record the spatial distribution as well as time distribution of the photons in the light pulse. As the resistive switching devices can be made to have a very fast switching time, on the order of nanoseconds or even picoseconds, the system may be used to measure light pulses with very short pulse widths.

To detect the incident photons in the light pulse 222, the system has a two-dimensional array 226 of fast photon detectors 228, such as avalanche photodiodes. The system may also include optical components 240 for projecting or imaging the incident light pulse onto the photon detector array 226. The optical components 240 may include, for instance, slits 242, lenses 244 or other focusing or defocusing elements, apertures, reflective or partially transmitting mirrors (stable or moving), etc. In some embodiments, the crossbar 200 of resistive switching devices may be positioned directly behind the photon detector array 226 to form a compact structure. Depending on the system configuration, there may be one or more resistive switching devices 210 corresponding to each photon detector 228. In some embodiments, the pixel as defined by each photon detector is sufficiently large such that there is very low probability of diffractive aliasing. For instance, the pixel dimensions may be on the order of half the wavelength of the incident light. In such a case, due to the high device density achievable in a crossbar array, there can be many resistive switching devices 210 in the crossbar 200 that correspond to each photon detector. FIG. 7 illustrates such an arrangement, in which the switching devices in a zone 232 commensurate with the pixel area defined by a particular photon detector 229 are all assigned to that photon detector, while the switching devices in the next zone 234 are assigned to an adjacent photon detector 230.

In one embodiment, during a pulse measurement operation, at t=T0, the controller 110 switches on the switching voltage $V_S$ for the resistive switching devices in the crossbar array 200. As described earlier, the switching voltage may have a fixed value or have a time-varying profile. When the photon detector 229 detects a first photon, it generates an event signal which is sent to the controller 110. This event signal functions as a trigger for the controller 110 to turn off the switching voltage applied to one of the switching devices in the zone 232 associated with that photon detector 229, so that the resistance of that switching device stops changing. When the photon detector 229 receives a second photon, the next switching device in the corresponding zone 232 is set by turning off the switching voltage applied to that device. In this way, photons received by the photon detector 229 cause the switching devices in the zone 232 to be sequentially set. Having multiple resistive switching devices for one photon detector allows multiple photons to be detected by each photon detector in one measurement process, and the arrival time of each detected photon can be recorded using one switching device.

After the light pulse 222 has passed, the controller 110 turns off the switching voltage to all the switching devices at t=T2. The resistance value of each switching device 210 can then be determined by performing a read operation. The resistance value shows not only if a photon has been detected by the associated photon detector but also when the photon is detected. In addition to the temporal distribution of the light pulse, the mapping of the 2-dimensional array 226 of photon detectors to the crossbar array 200 of resistive switching devices also allows the spatial distribution of the light pulse to be derived from the resistance readings of the resistive switching devices. After the resistance values are read out, the controller 110 can reset the switching devices in the crossbar array 200 by switching each switching device to its original pre-measurement state, which may be either the ON or OFF state depending on the system setup.

In some other embodiments, the photon detectors 228 may be made to be much smaller than the wavelength of the light to be detected. With the small photon detectors, a photon with a typical transverse packet of the size of the wavelength could trigger one of a number of adjacent photon detectors. In that case, the system may be configured such that there is only one switching device under the "pixel" defined by each photon detector. Since each switching device may be used to time-tag a single event, it may be desirable to configure the system such that each photon detector does not detect two or more photons in one measurement operation. In this regard, the probability that any one photon detector could be triggered more than once decreases in proportion to the surface area of the pixel, but also grows linearly with time. By making the pixel size much smaller than the light wavelength, the probability of one photon detector being triggered twice in one measurement session can be significantly reduced. In other words, the density of the photon detectors can be made sufficiently high such that each photon detector is likely to detect no more than one photon during one measurement. In this regard, the optical components 240 can also be used to control the energy density of the light projected onto the photon detector array 226 to assist in reducing the probability of multiple event detection by a single detector.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A system for detecting and recording events, comprising:
    a resistive switching device having a resistance adjustable by means of an applied voltage;
    a photon detector for detecting an event comprising incidence of a photon in a light pulse; and
    a controller for controlling operation of the resistive switching device, the controller to apply a switching voltage to the resistive switching device at a start time, and turn off the switching voltage in response to a signal indicating the incidence of the photon, wherein a value of the resistance of the resistive switching device resulting from application of the switching voltage is indicative of detection of the photon and a time of the incidence of the photon.

2. A system as in claim 1, wherein the resistive switching device includes an active region containing a switching material capable of carrying a species of dopants and transporting the dopants under an electrical field, wherein a redistribution of the dopants in the active region results in a change in the resistance of the resistive switching device.

3. A system as in claim 2, wherein the switching material is a metal oxide.

4. A system as in claim 3, wherein the switching material is titanium oxide.

5. A system as in claim 1, wherein the switching voltage increases with time.

6. A system as in claim 1, wherein the switching voltage has a fixed value.

7. A system for detecting and recording events, comprising:
    a two-dimensional array of photon detectors, each photon detector for detecting occurrence of an event comprising incidence of a photon in a light pulse and generating a signal;
    a plurality of resistive switching devices, each resistive switching device corresponding to a photon detector in the two-dimensional array and having a resistance adjustable by means of an applied voltage;
    a controller for controlling operation of the resistive switching devices, the controller to apply a switching voltage to a resistive switching device at a start time, and turn off the switching voltage to the resistive switching device in response to the signal generated by the corresponding photon detector, wherein a value of the resistance of the resistive switching device resulting from application of the switching voltage is indicative of detection of the incidence of the photon by the corresponding photon detector and a time of the incidence of the photon.

8. A system as in claim 7, wherein each resistive switching device includes an active region containing a switching material capable of carrying a species of dopants and transporting the dopants under an electrical field, and wherein a redistribution of the dopants in the active region results in a change in the resistance of the resistive switching device.

9. A system as in claim 8, wherein the switching material is a metal oxide.

10. A system as in claim 7, wherein the resistive switching devices form a crossbar array.

11. A system as in claim 7, further including optical components for projecting a light pulse on the two-dimensional photon detectors.

12. A system as in claim 7, wherein there are multiple resistive switching devices corresponding to each photon detector, and wherein the controller turns off the switching voltage to the multiple resistive switching devices sequentially in response to detection of photons by the corresponding photon detector.

13. A method of detecting and recording an event, comprising:
  applying a switching voltage to a resistive switching device at a start time to change a resistance of the resistive switching device with time;
  detecting occurrence of an event comprising incidence of a photon in a light pulse with a photon detector and generating a signal indicative of detection of the photon; and
  turning off the switching voltage in response to the signal, wherein a value of the resistance of the resistive switching device resulting from application of the switching voltage is indicative of detection of the photon and a time of the occurrence of the photon.

* * * * *